United States Patent [19]
Templeton, Jr. et al.

[11] Patent Number: 5,457,340
[45] Date of Patent: Oct. 10, 1995

[54] LEADFRAME WITH POWER AND GROUND PLANES

[75] Inventors: Thomas H. Templeton, Jr., Fremont; Christopher P. Wyland, Campbell; David L. Campbell, Sunnyvale, all of Calif.

[73] Assignee: Integrated Device Technology, Inc., Santa Clara, Calif.

[21] Appl. No.: 986,951

[22] Filed: Dec. 7, 1992

[51] Int. Cl.⁶ .......................... H01L 23/48; H01L 29/44; H01L 29/52; H01L 29/60
[52] U.S. Cl. .......................... 257/666; 257/676; 257/690; 257/691; 257/728; 257/782
[58] Field of Search ......................... 257/666, 667, 257/670, 672, 700, 758, 668, 701, 759, 676, 690, 691, 728, 782, 783, 784, 798

[56] References Cited

U.S. PATENT DOCUMENTS

| | | |
|---|---|---|
| 4,680,613 | 7/1987 | Daniels et al. |
| 4,791,473 | 12/1988 | Phy . |
| 4,916,506 | 4/1990 | Gagnon . |
| 4,933,741 | 6/1990 | Schroeder . |
| 4,965,654 | 10/1990 | Karner et al. . |
| 5,060,052 | 10/1991 | Casto et al. . |
| 5,067,005 | 11/1991 | Michii et al. ............ 257/700 |
| 5,068,708 | 11/1991 | Newman . |
| 5,173,767 | 12/1992 | Lange et al. ............ 257/700 |

FOREIGN PATENT DOCUMENTS

| | | |
|---|---|---|
| 4130653 | 5/1982 | Japan ............ 257/668 |
| 63-293869 | 11/1988 | Japan . |
| 1143246 | 6/1989 | Japan ............ 257/666 |
| 2168533 | 6/1986 | United Kingdom . |

Primary Examiner—Sara W. Crane
Assistant Examiner—Carl Whitehead, Jr.
Attorney, Agent, or Firm—Skjerven, Morrill, MacPherson, Franklin & Friel; Alan H. MacPherson; David T. Millers

[57] ABSTRACT

A leadframe for use in an integrated circuit package is described. The leadframe comprises a plurality of electrically conductive leads, a die attach pad, and an electrically conductive ring or rings formed generally around the circumference of the die attach pad and between the die attach pad and leads. In one embodiment, at least one of the leads is formed integrally with each ring. The die attach pad may also be formed integrally with one or more leads. In another embodiment, the ring or rings are formed so that they are electrically isolated from the die attach pad, and the die attach pad, leads, and ring or rings are all formed in substantially the same plane. In some embodiments, the ring or rings are broken into electrically isolated sections. Each of the ring sections (and die attach pad, if appropriate) may be electrically connected to a voltage source outside the integrated circuit package (e.g., a power supply or ground). The leadframe is formed from a single sheet of material by, for instance, stamping or etching. The leadframe may be used in either ceramic or plastic packages. The leadframe reduces switching noise and crosstalk, allows more flexibility in placement of power and/or ground bond pads on the die, and allows provision of ground and power planes in an integrated circuit package that is thinner than previous integrated circuit packages containing both ground and power planes.

47 Claims, 12 Drawing Sheets

5,457,340

LEADFRAME WITH POWER AND GROUND PLANES

BACKGROUND OF THE INVENTION

1. Field of the Invention

This invention relates to integrated circuits and, in particular, to the provision of power and ground planes in an integrated circuit package.

2. Related Art

The presence of resistance, capacitance and inductance in the electrical conductors (e.g., bond wires, leads) within an integrated circuit package gives rise to noise (signal delays and signal distortions) in the electrical signals transmitted to and from the integrated circuit (a semiconductor die on which electrically conductive circuitry and bond pads are formed). Two sources of noise in an integrated circuit package are switching noise ($\Delta I$ noise) and crosscoupling noise (crosstalk). Switching noise may be an inductive voltage spike that occurs on a conductive path as the result of rapid current switching in the conductive path. Crosstalk is the undesirable appearance of an electrical current in a conductive path as a result of mutual capacitance and inductance between the conductive path and other nearby conductive paths.

By varying the geometries and materials of integrated circuit package components such as signal leads, bond wires, vias, ground planes and power planes, various electrical characteristics of the integrated circuit package can be changed such as decoupling capacitances, resistances and self-inductances of current paths, and capacitances and mutual inductances between adjacent current paths. As a consequence, electrical noise can be reduced.

In current high speed digital systems, subnanosecond signal transition times are common. Such high speed operation exacerbates the problems of switching noise and crosstalk. Bond wire inductance, effective inductance in power, ground and signal (i.e., other than power or ground) paths, and inductive coupling between adjacent current paths are particularly troublesome.

Previously, ground and power planes have been used in integrated circuit packages in an attempt to provide uniform ground and power supplies to the integrated circuit and to reduce electrical noise. FIG. 1 is a cross-sectional view of a typical packaged integrated circuit 100 comprising a semiconductor die 101 attached with an adhesive 102 to an electrically conductive die attach pad 103 on which is formed a ground plane or power plane. Electrically conductive leads 104 are attached to the die attach pad 103 with electrically insulative adhesive 105. Layer 106, which comprises a ground or power plane, is attached to the die attach pad 103 with an electrically insulative adhesive 107 on a side of the die attach pad 103 opposite that to which the die 101 is attached. Bond wires 108 are used to make electrical connection between selected ones of the leads 104, the die attach pad 103, and the die 101.

Such a multilayer structure has several disadvantages. Conductive vias and traces are often necessary as part of the connection from the power and/or ground plane to on-chip supply or ground. These vias and traces have an additional self-inductance that increases switching noise. Additionally, the multilayer structure is more complex and expensive to produce since additional metal layers, dielectric layers, traces and vias must be formed. This additional complexity can adversely affect the electrical and mechanical reliability of the integrated circuit package.

It is desirable to increase the cross-sectional area and minimize the length of current paths so as to minimize the self-inductance of current paths (especially power and ground paths). Thus, there is a need for an integrated circuit package in which the above benefits are achieved and the above problems overcome.

SUMMARY OF THE INVENTION

In accordance with the invention, a leadframe, for use with an integrated circuit package, comprises a plurality of electrically conductive leads, a die attach pad, and at least one electrically conductive ring formed generally around the circumference of the die attach pad and between the die attach pad and leads. Typically, the ring or rings act as power and/or ground planes, though each of the ring or rings may be connected to a voltage source having any voltage potential. In some embodiments of the invention, the die attach pad may also be connected to a voltage source having a desired voltage potential.

The leadframe according to the invention is assembled into an integrated circuit package. A semiconductor die is mounted on the die attach pad. Electrically conductive bond wires are used to make electrical connections between bond pads on the semiconductor die and selected ones of the leads, selected locations on the die attach pad, and selected locations on the ring or rings. The leadframe, die and bond wires are enclosed inside protective, electrically insulative material such as, for instance, ceramic or plastic.

According to one embodiment of the invention, at least one lead is formed integrally with each of the ring or rings to allow connection to electrical components outside the package. The die attach pad may also be formed integrally with one or more leads to allow connection to electrical components outside the package.

According to another embodiment of the invention, the ring or rings are formed so that they are electrically isolated from the die attach pad, and the die attach pad, leads, and ring or rings are all formed in substantially the same plane. The ring or rings are each electrically connected to at least one of the leads by any appropriate method so that each of the ring or rings can be connected to an appropriate voltage source (e.g., electrical power supply or ground) outside of the package. The die attach pad may also be electrically connected to a voltage source outside the package.

In some embodiments of the invention, the ring or rings are formed in sections that are electrically isolated from each other so that different sections of the same ring can be set at different voltage potentials.

The leadframe according to the invention is formed from a single sheet of material by, for instance, stamping or etching.

An integrated circuit package including the leadframe according to the invention has reduced effective inductance and crosstalk relative to existing integrated circuit packages. In particular, provision of parallel current paths from power and/or ground planes inside the package to voltage sources outside the package minimizes inductance and, thus, noise in power and ground paths. The leadframe according to the invention also provides off-chip power and ground bussing that allows more flexibility in layout of the circuitry on the die, thus allowing reduction of across-die voltage drops. Formation of the die attach pad, leads and ring in substantially one plane, as in some embodiments of the invention, allows provision of ground and power planes in an integrated circuit package that is thinner than previous integrated circuit packages containing both ground and power planes. The above improvements can be provided in an inexpensive and simple leadframe using conventional formation techniques and materials.

DETAILED DESCRIPTION OF THE PREFERRED EMBODIMENTS

Figure 1:
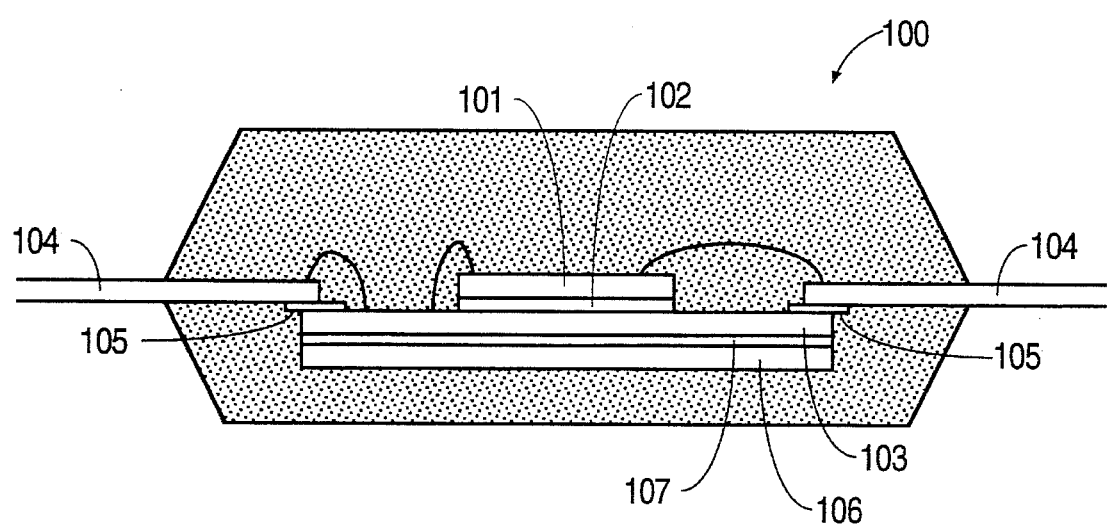
FIG. 1 is a cross-sectional view of a prior art packaged integrated circuit including power and ground planes.
Figure 2A:
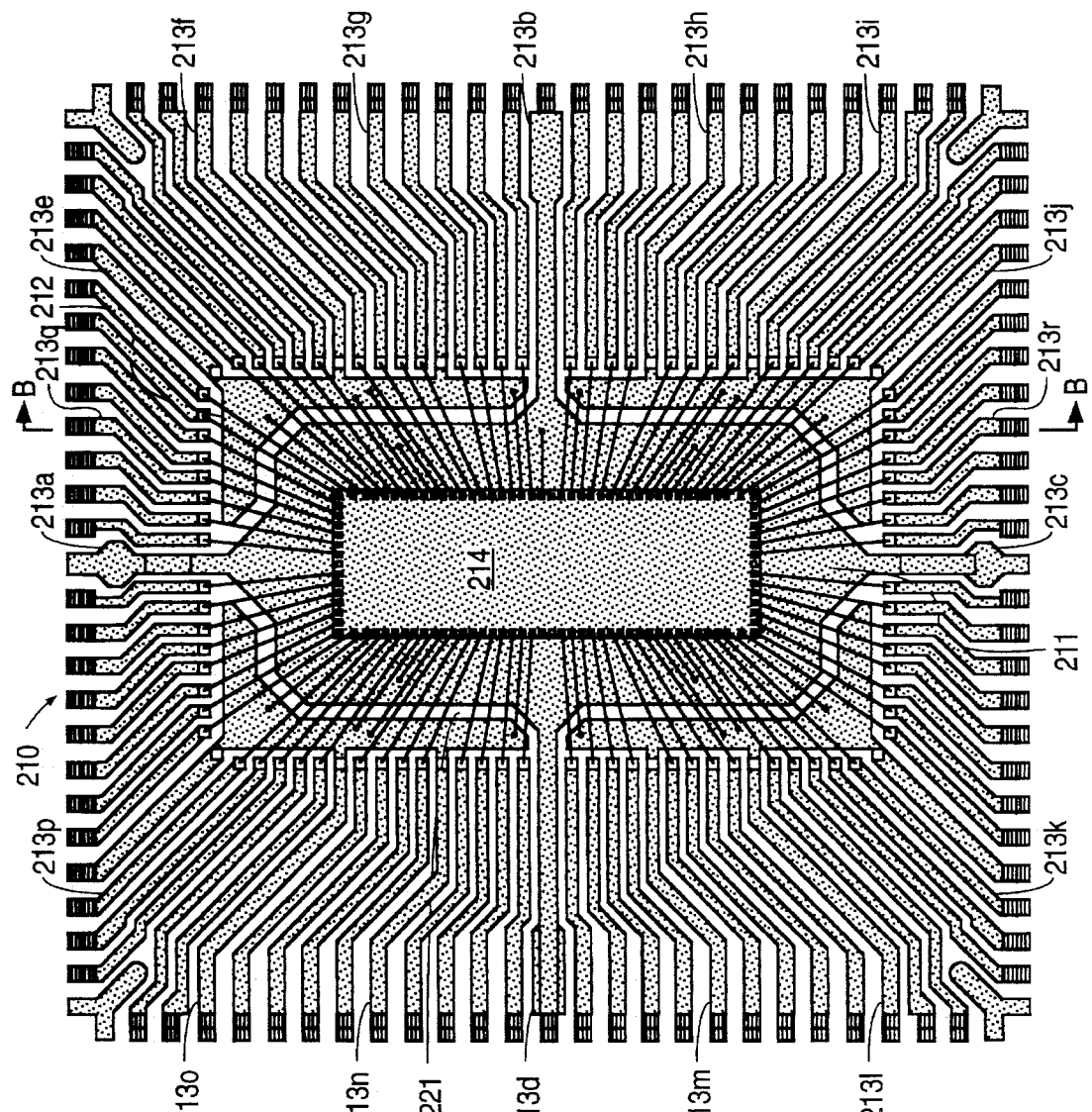
FIG. 2A is a plan view of a semiconductor die mounted on a leadframe according to an embodiment of the invention.
Figure 2B:
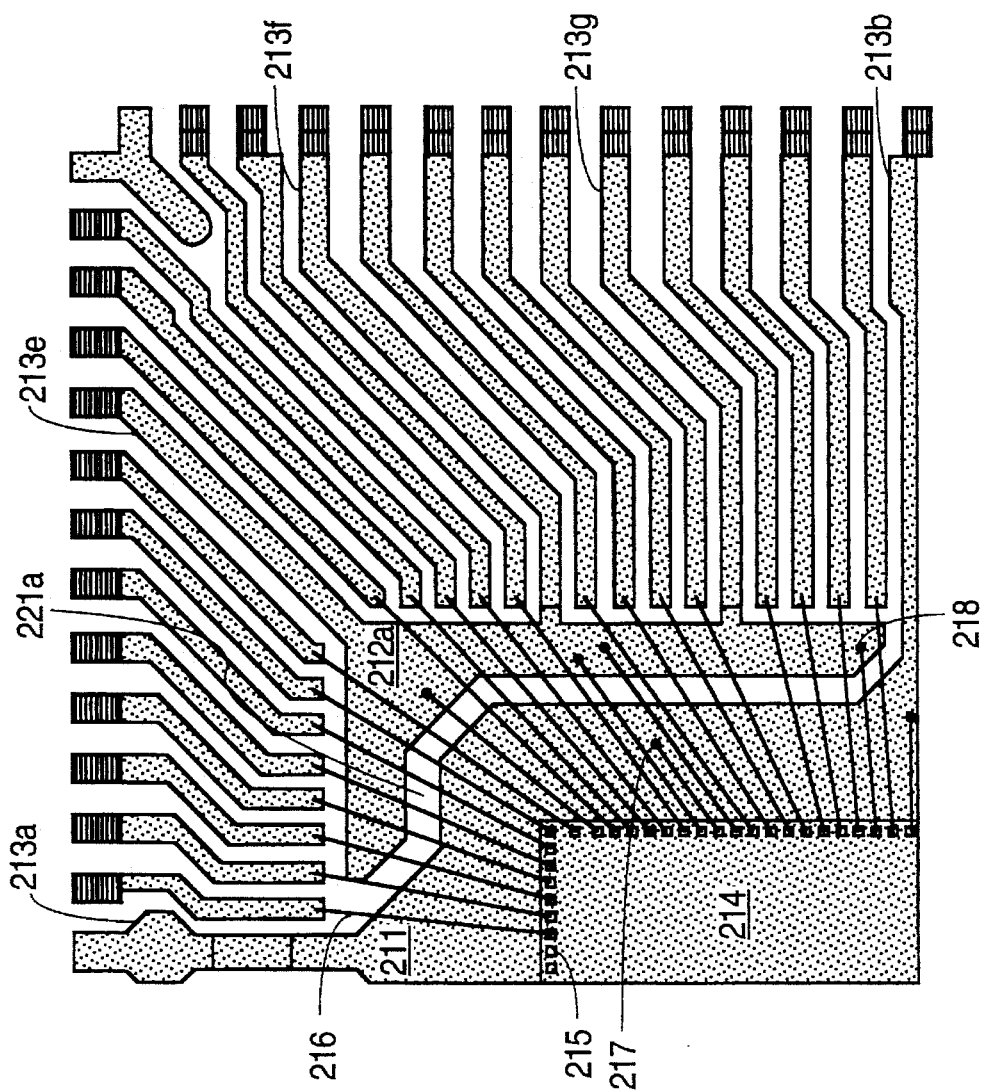
FIG. 2B is a detailed plan view of a section of the die and leadframe shown in FIG. 2A.

In accordance with the invention, a leadframe is provided for use with an integrated circuit package. FIGS. 2A and 2B are a plan view and detailed plan view, respectively, of a semiconductor die 214 mounted on a leadframe 210 according to an embodiment of the invention.

The leadframe 210 comprises a die attach pad 211, a ring 212 and a plurality of leads 213. (In FIGS. 2A and 2B, several particular leads are identified, e.g., lead 213a. All leads or a typical lead that may or may not be specifically identified will be referred to as leads or lead 213, though 213 does not appear as a numerical designation in the drawings.) The die attach pad 211 is formed approximately in the center of the leadframe 210. The ring 212 is formed generally around the periphery of the die attach pad 211 with a gap 221 separating the die attach pad 211 and ring 212. The gap 221 is necessary to ensure electrical isolation between the die attach pad 211 and ring 212. The leads 213 are formed generally around the ring 212, opposite the side of the ring 212 adjacent the die attach pad 211, so that most of the leads 213 do not contact either the ring 212 or die attach pad 211.

In the leadframe 210, four leads 213a, 213b, 213c, 213d are formed integrally with the die attach pad 211. Twelve leads 213e, 213f, 213g, 213h, 213i, 213j, 213k, 213l, 213m, 213n, 213o, 213p are formed integrally with the ring 212. Since electrical isolation between the ring 212 and die attach pad 211 must be maintained, the ring 212 is broken into four sections, e.g., ring section 212a (see FIG. 2B), by the leads 213a, 213b, 213c, 213d. Likewise, the gap 221 is broken into four sections, e.g., gap section 221a (again, see FIG. 2B) by the leads 213a, 213b, 213c, 213d.

It is to be understood that a leadframe according to the invention can be formed with other than four leads formed integrally with the die attach pad and other than twelve leads formed integrally with the ring. Generally, any number of leads may be formed integrally with the die attach pad and any number of leads may be formed integrally with the ring. Preferably, a plurality of leads are formed integrally with each of the die attach pad and the ring for reasons explained below.

The leadframe 210 is assembled into an integrated circuit package. The semiconductor die 214 comprises circuitry (not shown) formed centrally on the die 214 and a plurality of bond pads 215 formed around the periphery of the die 214. The semiconductor die 214 is mounted on the die attach pad 211. Electrically conductive bond wires 216 are used to connect selected bond pads 215 on the die 214 to selected ones of the leads 213, selected bond locations 217 on the die attach pad 211 and selected bond locations 218 on the ring 212.

Both the area of the die attach pad 211 not covered by the die 214 and the areas of the ring sections, e.g., ring section 212a, are sufficiently large to allow formation of bonds at a plurality of bond locations 217 and 218, respectively. In accordance with the invention, any number of bonds may be formed on the ring sections, e.g, ring section 212a, and die attach pad 211. The invention contemplates that at least one bond is formed on each ring section, e.g., ring section 212a, and the die attach pad 211. The bond locations 217 and 218 are chosen primarily so as to minimize the length of the bond wires 216 between ground and power bond pads 215 on the die 214 and the corresponding bond locations 217 or 218, and secondarily so as to minimize the distance between the bond pad locations 217 or 218 and the closest one of the corresponding integral leads, e.g., lead 213a or 213e.

Figure 3:
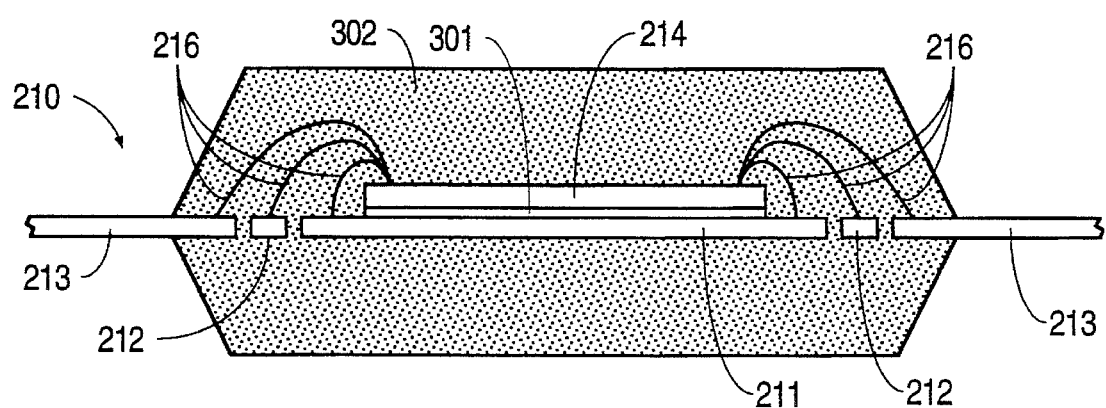
FIG. 3 is a cross-sectional view of a packaged integrated circuit including the leadframe of FIG. 2A taken along section A—A of FIG. 2A.

FIG. 3 is a cross-sectional view of a packaged integrated circuit 300, including the semiconductor die 214 and leadframe 210 of FIG. 2A, taken along section B—B of FIG. 2A. (The section B—B does not pass in a straight line through the leadframe 210, but, rather, passes along a path through the lead 213q, through a straight line to lead 213r, and through the lead 213r. This is done to better illustrate the features of the invention.) The die 214 is mounted on the die attach pad 211 of the leadframe 210 with an adhesive 301. It is to be understood that the die 214 may be mounted on the die attach pad 211 in any manner that holds the die 214 in place on the die attach pad 211.

The adhesive 301 may be either electrically insulative or electrically conductive depending on the voltage bias of the substrate of the die 214 and the electrical function of the die attach pad 211. If the substrate bias matches the potential of the die attach pad 211 (e.g., substrate at ground potential and die attach pad 211 acting as a ground plane), then the adhesive 301 is electrically conductive. If the substrate bias does not match the potential of the die attach pad 211 (i.e., substrate at the same potential as the power supply and die attach pad 211 functioning as a ground plane), then the adhesive 301 is electrically insulative.

The adhesive 301 may be, for instance, an epoxy, thermoplastic or polyimide resin as are commonly available from vendors such as Able-stick, Stay-stick, or Sumitomo. When it is desired that the adhesive 301 be electrically conductive, the adhesive 301 is filled with pieces of an electrically conductive material such as, for instance, silver. When it is desired that the adhesive 301 be electrically insulative, the adhesive 301 may contain, for instance, alumina ($Al_2O_3$), aluminum nitride (AlN) or diamond. When an epoxy or polyimide adhesive 301 is used, the adhesive 301 is applied in paste form, the die 214 is attached, and the adhesive 301 is baked to drive out volatile solvents and achieve cross-linking. When a thermoplastic adhesive 301 is used, the adhesive 301 is heated until tacky, the die 214 is attached, and the adhesive 301 is cooled to solidify and attach the die 214.

The leadframe 210, die 214 and bond wires 216 are encapsulated in, for instance, plastic 302 so that the ends of the leads 213 are exposed outside the plastic 302. Leadframes according to the invention may be used not only with plastic encapsulated integrated circuit packages, but also with integrated circuit packages enclosed by ceramic such as CERDIP or CERQUAD. Further, the plastic packages may be formed in any manner such as by transfer molding, plastic injection molding, or potting.

The exposed ends of the leads 213 are used to make electrical connection to electronic components outside the packaged integrated circuit 300. In particular, the leads 213a, 213b, 213c, 213d may be connected to, for instance, either an electrical power supply or electrical ground. If the leads 213a, 213b, 213c, 213d are connected to a power supply, then the die attach pad 211 acts as a power plane inside the packaged integrated circuit 300. If the leads 213a, 213b, 213c, 213d are connected to an electrical ground, then the die attach pad 211 acts as a ground plane. Likewise, the leads 213e, 213f, 213g, 213h, 213i, 213j, 213k, 213l, 213m, 213n, 213o, 213p may also be connected to, for instance, either an electrical power supply or an electrical ground so that the ring 212 acts as either a power plane or a ground plane. Typically, if the die attach pad 211 is a power plane, then the ring 212 is a ground plane and vice versa. Electrical connection is made from the die attach pad 211 and ring 212 to bond pads 215 formed on the die 214.

Though, in the above description, the die attach pad 211 and ring 212 function as either power or ground planes, it is to be understood that either of the die attach pad 211 or ring 212 may held at any voltage potential by connecting the appropriate set of leads, e.g. leads 212a, 212b, 212c, 212d, to a voltage source outside the packaged integrated circuit 300 that has the desired voltage potential. Further, each of the ring sections, e.g., ring section 212a, may be held at different voltage potentials. For instance, one ring section, e.g., ring section 212a, may act as ground plane while another acts as a power plane.

Figure 4A:
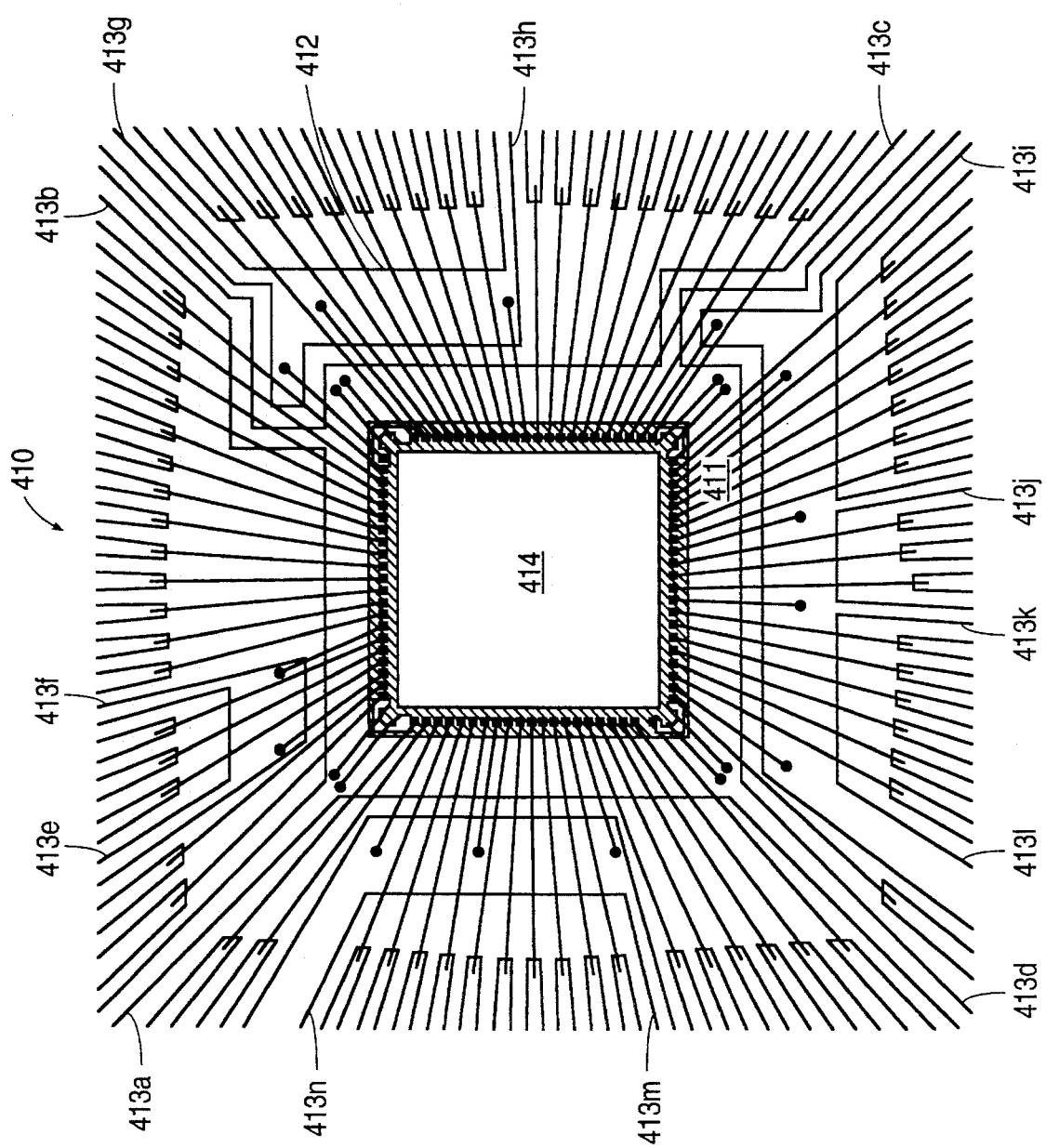
FIG. 4A is a plan view of a semiconductor die mounted on a leadframe according to another embodiment of the invention.
Figure 4B:
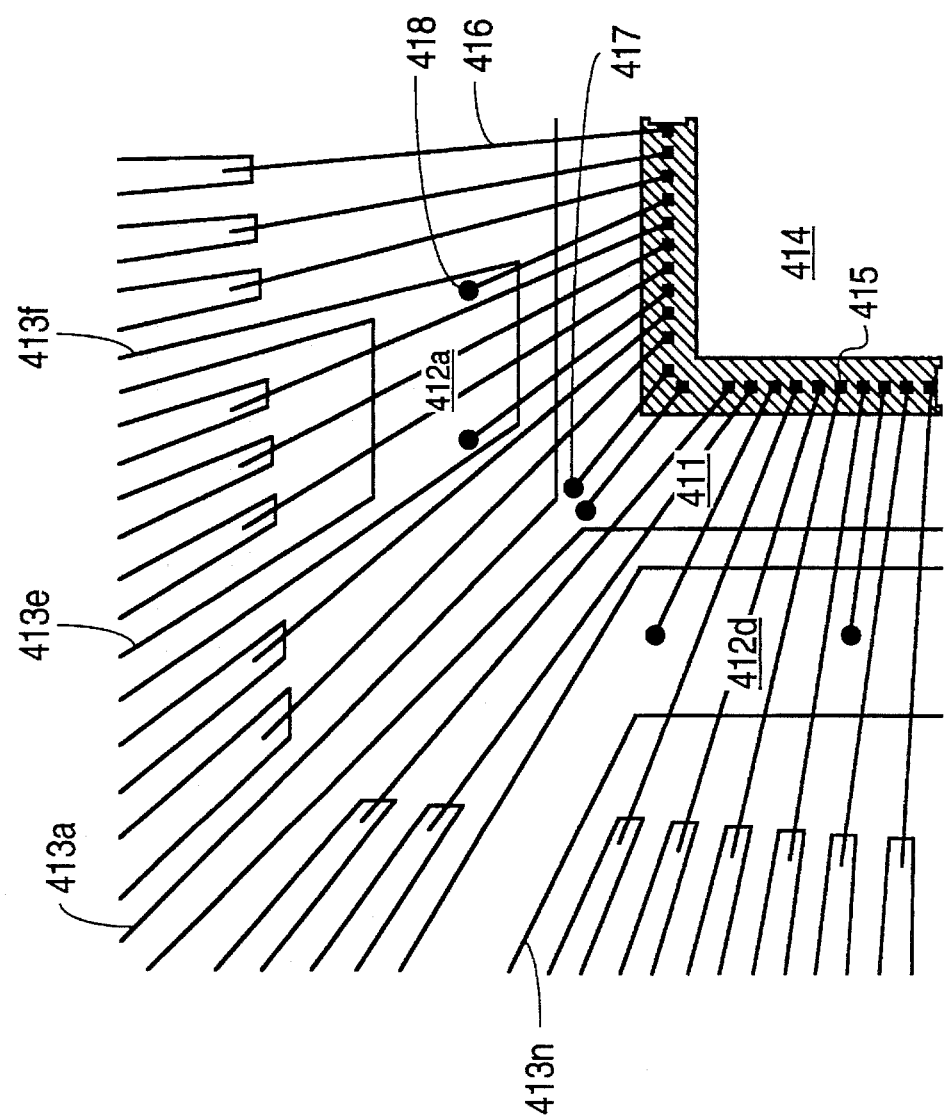
FIG. 4B is a detailed plan view of a section of the die and leadframe shown in FIG. 4A.
Figure 4C:
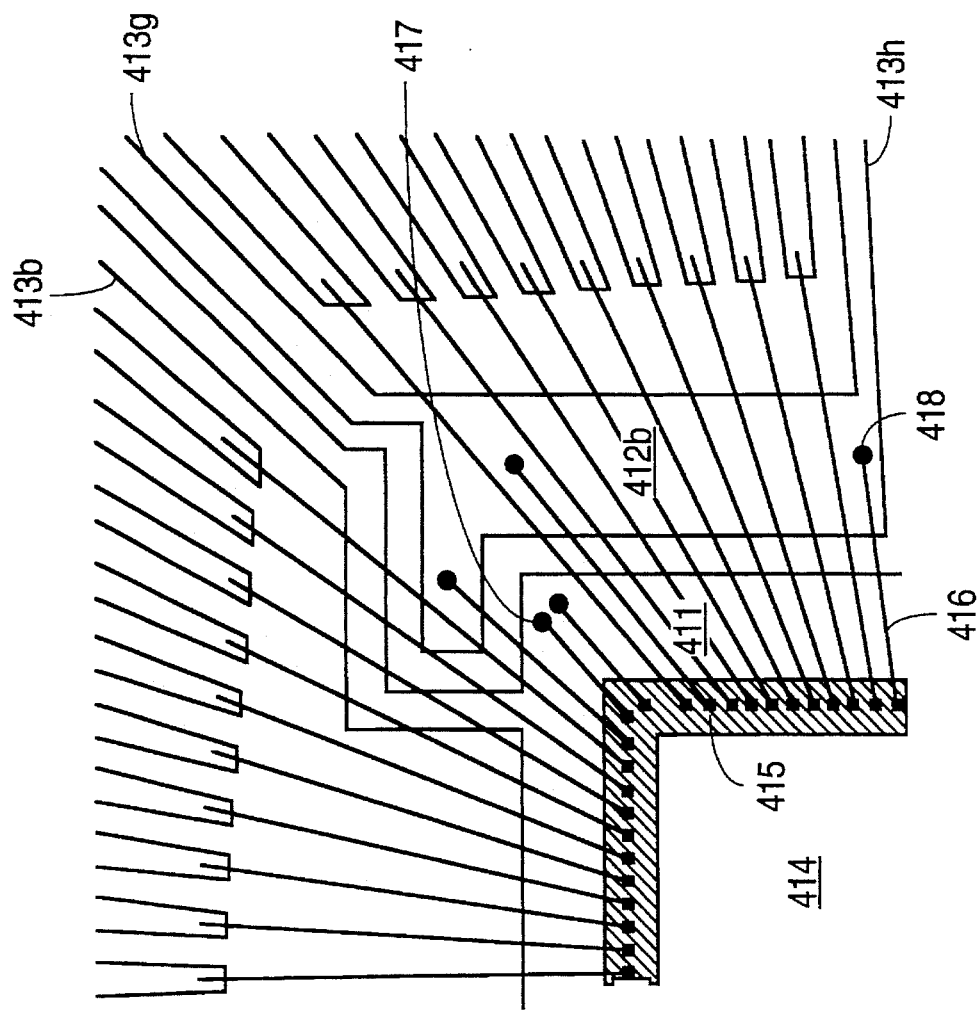
FIG. 4C is a detailed plan view of a section of the die and leadframe shown in FIG. 4A.
Figure 4D:
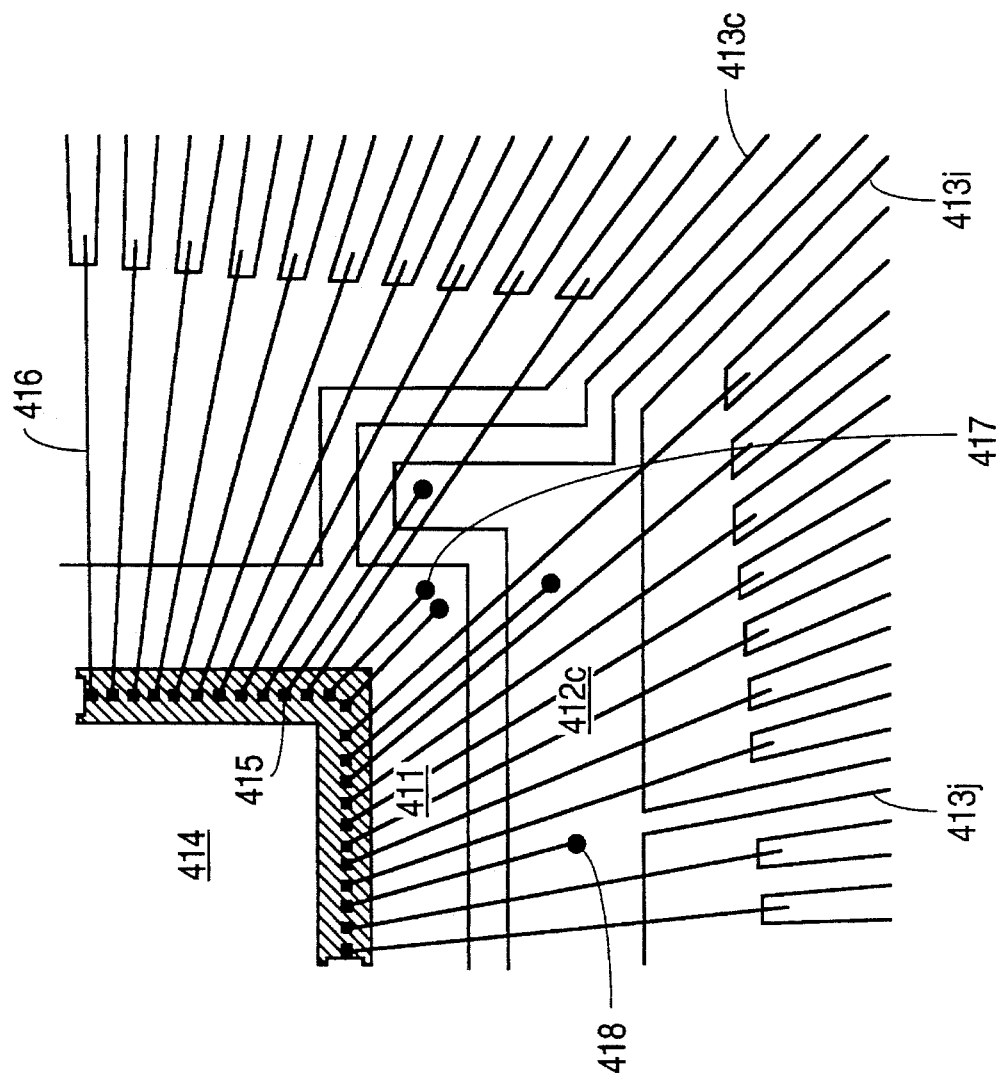
FIG. 4D is a detailed plan view of a section of the die and leadframe shown in FIG. 4A.
Figure 4E:
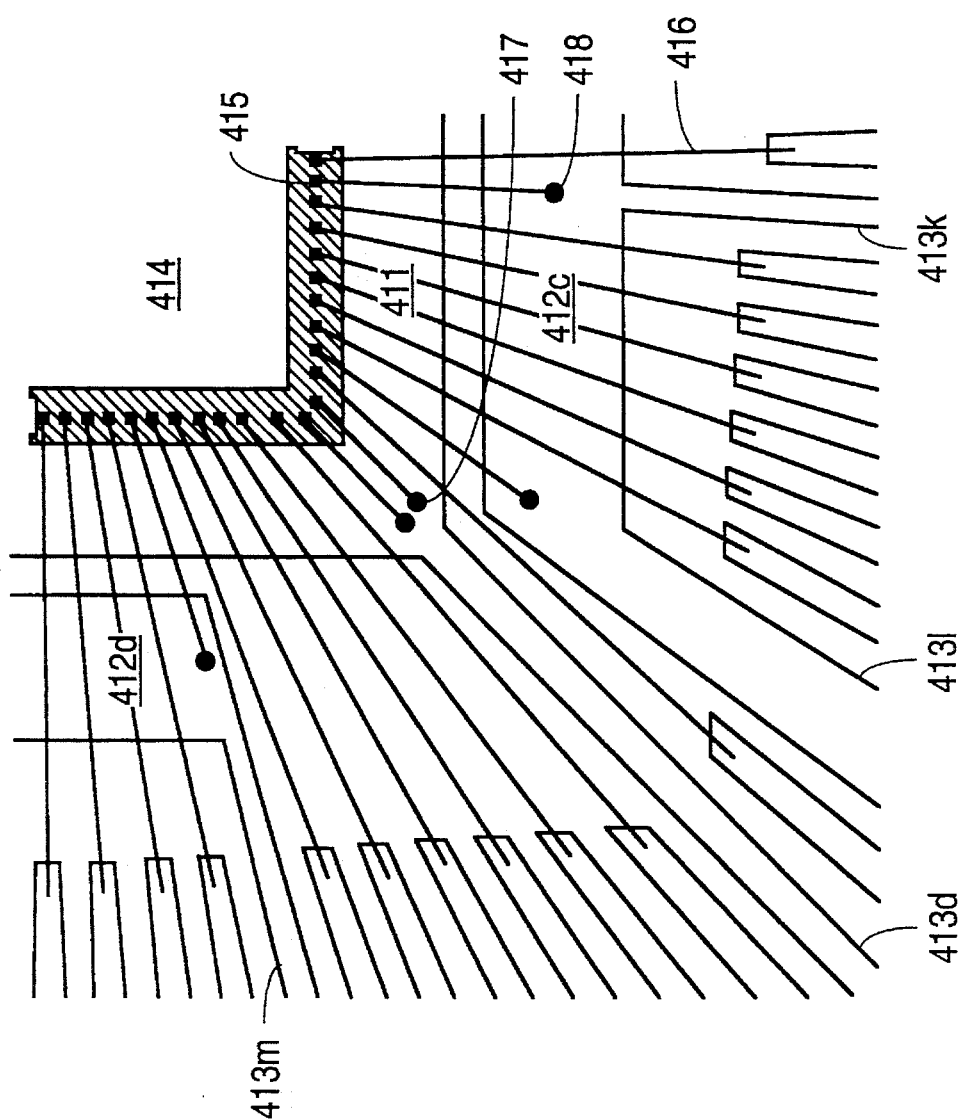
FIG. 4E is a detailed plan view of a section of the die and leadframe shown in FIG. 4A.

FIG. 4A is a plan view of a semiconductor die 414 mounted on a leadframe 410 according to another embodiment of the invention. FIGS. 4B, 4C, 4D and 4E are detailed plan views of the die 414 and leadframe 410 of FIG. 4A. The leadframe 410 comprises a die attach pad 411, ring 412 and plurality of leads 413. (As in FIGS. 2A and 2B, particular leads are identified in FIGS. 4A–4E, e.g., lead 413a. All leads or a typical lead are referred to as leads or lead 413, though 413 does not appear as a numerical designation in the drawings.) The ring 412 is formed generally around and does not contact the periphery of the die attach pad 411. The leads 413 are formed generally around the periphery of the ring 412 and, except as noted below, do not touch the ring 412 or the die attach pad 411. The die attach pad 411 is formed integrally with four leads 413a, 413b, 413c, 413d. The ring 412 is formed integrally with ten leads 413e, 413f, 413g, 413h, 413i, 413j, 413k, 413l, 413m, 413n.

The semiconductor die 414 is mounted on the die attach pad 411. Circuitry (not shown) and bond pads 415 are formed on the die 414. Electrically conductive bond wires 416 connect selected ones of the bond pads 415 to selected ones of the leads 413, selected bond locations 417 on the die attach pad 411, or selected bond locations 418 on the ring 412.

The leadframe 410, die 414 and bond wires 416 are enclosed in protective, electrically insulative material such that ends of the leads 413 are exposed to allow connection to be made to other electrical components. The leads 413a, 413b, 413c, 413d may be connected to, for instance, either an electrical power supply or electrical ground to allow the die attach pad 411 to function as either a power plane or ground plane. Likewise, the leads 413e, 413f, 413g, 413h, 413i, 413j, 413k, 413l, 413m, 413n may be connected to, for instance, an electrical power supply or electrical ground to allow the ring 412 to function as the other of a ground plane or power plane. As for the leadframe 210 of FIGS. 2A and 2B, either of the die attach pad 411 or ring 412 may be connected to a voltage supply that establishes the die attach pad 411 or ring 412 at a voltage potential other than the power or ground voltage potential.

Since the ring 412 and die attach pad 411 must be electrically isolated, the leads 413a, 413b, 413c, 413d break the ring 412 into four ring sections 412a, 412b, 412c, 412d (see FIGS. 4B, 4C, 4D, 4E). As with the ring 212 of the leadframe 210, each of the ring sections 412a, 412b, 412c, 412d may be set at different voltage potentials, as desired, by connecting the appropriate leads, e.g., leads 413e, 413f of ring section 412a, to a voltage source having the desired voltage potential.

The ring 412 does not include all of the area that might have been used for the ring 412. This is because, for the particular integrated circuit for which the leadframe 410 is intended, there are no ground or power bond pads 415 formed on the semiconductor die 414 in the vicinity of the unused areas. Therefore, provision of additional area in the ring 412 would provide little or none of the benefits of the invention as described in more detail below. Since the additional area might cause problems (e.g., undesired contact with bond wires 416 due to bond wire sweep during formation of a plastic package), the additional area was eliminated from the ring 412.

Preferably, particularly in leadframes according to the invention in which the die attach pad and/or ring are used as a ground and/or power plane, a plurality of leads (ground and power leads) are formed integrally with each of the die attach pad and/or ring. This allows parallel current paths between each of the ground and power planes and the respective voltage supply outside the integrated circuit package. Since multiple current paths are provided at various locations, the length of individual current paths is small and the cross-sectional area of the total current path (i.e., the sum of the cross-sectional areas of each of the integrally formed leads) is large. Since the inductance of a conductor is directly proportional to the length and inversely proportional to the cross-sectional area of the conductor, the multiple ground and power leads reduce the inductance of the ground and power current paths. Consequently, ground and power noise that arises as a result of switching on the integrated circuit is minimized.

Further, as illustrated in the leadframe 410 of FIG. 4, some of the leads 413, e.g., leads 413l and 413n, formed integrally with the ring 412 or die attach pad 411 may be made larger than the rest of the leads 413. This increases the cross-sectional area of the ground or power current paths, reducing the generated noise even more.

In addition to the above benefits of leadframes according to the invention, the provision of a ring in leadframes according to the invention allows greater flexibility in placement of ground and/or power circuit elements and bond pads on the semiconductor die. Generally, in order to minimize the length of the ground and/or power current paths (thereby minimizing inductance and, thus, noise) on an integrated circuit, it is desirable to locate ground and/or power circuit elements and bond pads on the semiconductor die in proximity to the ground and/or power lead or leads. However, for a typical integrated circuit, this results in large undesirable across-die voltage drops. Additionally, the layout of the circuitry on the die is undesirably constrained. Provision of multiple ground and power leads spaced roughly equally around the leadframe, allows minimum power and ground noise to be obtained while allowing greater flexibility in layout of the circuitry on the die so that across-die voltage drops are minimized.

Leadframes according to the invention result in closer placement of ground and power planes to the die than has previously been the case. Consequently, as illustrated in FIG. 2B, shorter bond wires 216 are needed to make connection between bond pads 215 on the die 214 and the ground or power plane (die attach pad 211 and ring 212). Since bond wires 216 are a primary source of inductance because of their relative thinness, the shortening of these bond wires 216 significantly reduces the inductance in the power and ground current paths. In contrast, longer bond wires 216 are needed to make connection between bond pads 215 on the die 214 and signal leads (leads 213 other than power or ground leads 213a, 213b, 213c, 213d, 213e, 213f, 213g, 213h, 213i, 213j, 213k, 213l, 213m, 213n, 213o, 213p), thus increasing the inductance in signal current paths. However, typically, noise in the ground and power current paths is of greater concern so that the tradeoff inherent in leadframes according to the invention carries a net benefit.

The above improvements in electrical performance are provided by a leadframe that is simple and inexpensive to produce. Leadframes according to the invention can be formed in a single process step from a single piece of material using conventional formation techniques (e.g., stamping or etching) and conventional materials (e.g., standard leadframe metal such as nickel-iron, clad strip or copper based alloys). Leadframes according to the invention eliminate the need to provide power and ground planes in a multilayer structure that is more complex and expensive to produce and has greater electrical noise.

Figure 5A:
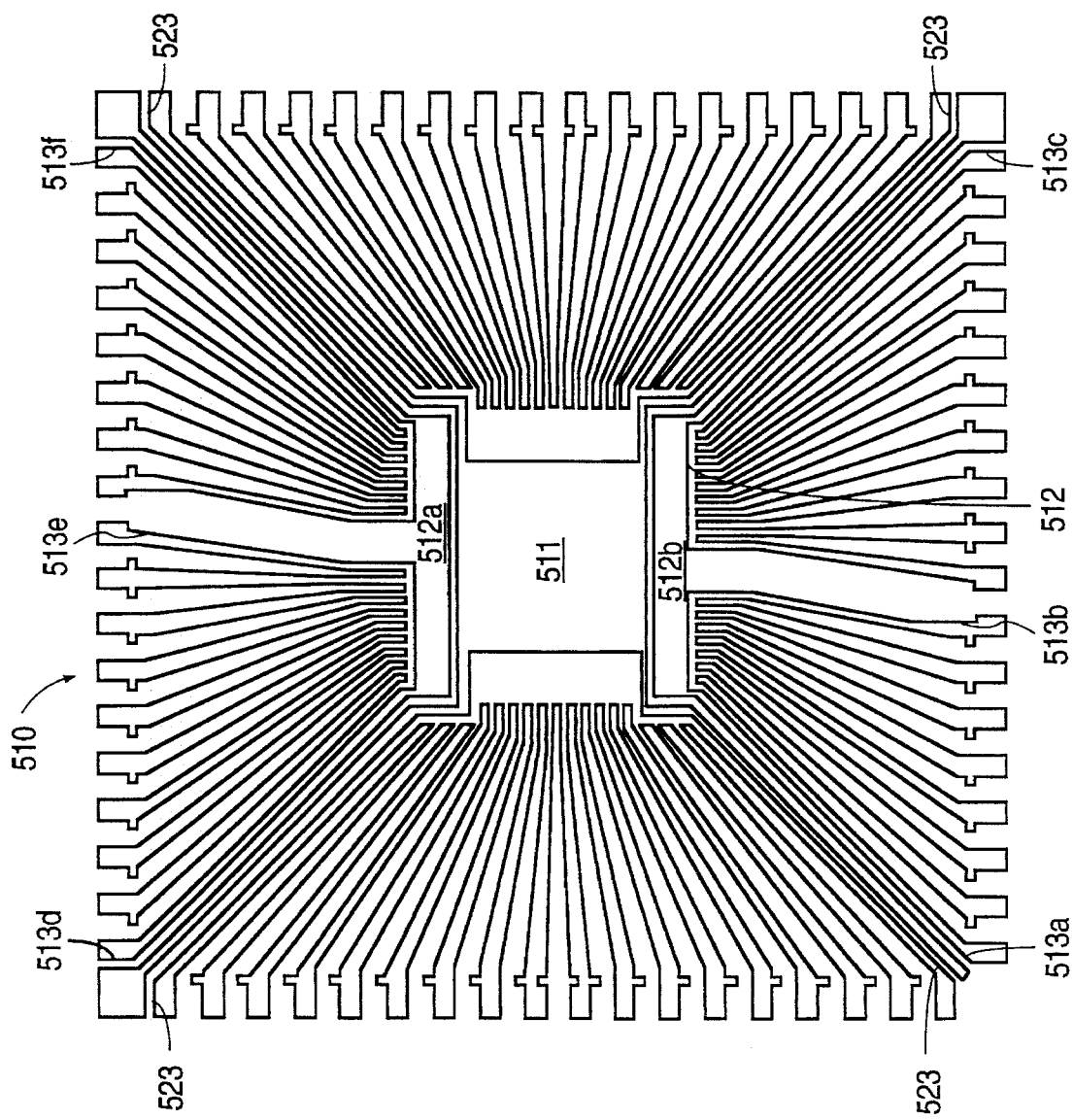
FIG. 5A is a plan view of a leadframe according to another embodiment of the invention.
Figure 5B:
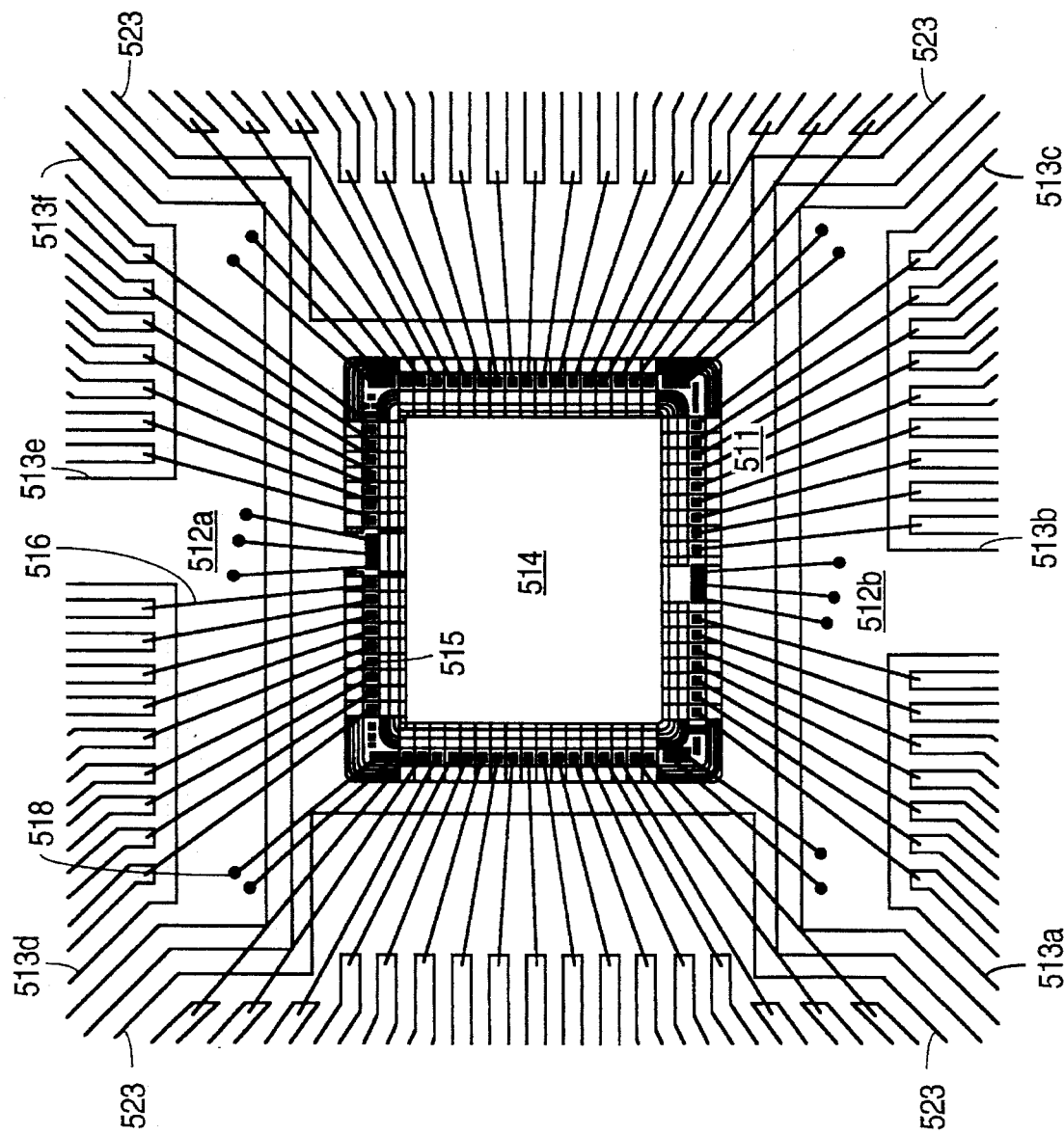
FIG. 5B is a detailed plan view of the leadframe of FIG. 5A with a semiconductor die mounted on the die attach pad of the leadframe.

In addition to the above described embodiments, leadframes according to the invention can also comprise a die attach pad which performs no electrical function in the integrated circuit package. FIG. 5A is a plan view of a leadframe 510 according to such an embodiment of the invention. FIG. 5B is a detailed plan view of the leadframe 510 of FIG. 5B with a semiconductor die 514 mounted on a die attach pad 511 of the leadframe 510.

The leadframe 510 comprises the die attach pad 511, a ring 512 and a plurality of leads 513. (As in FIGS. 2A, 2B and 4A–4E, particular leads are identified in FIGS. 5A and 5B, e.g., lead 513a. All leads or a typical lead are referred to as leads or lead 513, though 513 does not appear as a numerical designation in the drawings.) The ring 512 is formed on two opposing sides of the die attach pad 511. The ring 512 does not contact the periphery of the die attach pad 511. The leads 513 are formed generally around the periphery of the ring 512 and die attach pad 511. Generally, the leads 513 do not touch the ring 512; however, the ring 512 is formed integrally with six leads 513a, 513b, 513c, 513d, 513e, 513f. None of the leads 513 contact the die attach pad 511. The die attach pad 511 is connected to the rest of the leadframe 510 by tie bars 523.

The semiconductor die 514 is mounted on the die attach pad 511. Circuitry (not shown) and bond pads 515 are formed on the die 514. Electrically conductive bond wires 516 connect selected ones of the bond pads 515 to selected ones of the leads 513 or selected bond locations 518 on the ring 512.

The leadframe 510, die 514 and bond wires 516 are enclosed in protective, electrically insulative material such that ends of the leads 513 and tie bars 523 are exposed. The exposed ends of the leads 513 allow connection to be made to other electrical components. Both the set of leads 513a, 513b, 513c and the set of leads 513d, 513e, 513f may be connected to either an electrical power supply or electrical ground to allow the ring sections 512b and 512a, respectively, to function as either a power plane or ground plane. Note that both ring sections 512a, 512b can be power planes, both can be ground planes, or one can be a ground plane and the other a power plane. Additionally, the ring sections 512a, 512b can be set to any desired voltage potential by making connection to an appropriate voltage source outside the integrated circuit package.

After the leadframe 510, die 514 and bond wires 516 are enclosed in the protective material, the tie bars 523 are cut off. Consequently, no electrical connection can be made to the die attach pad 511 from outside the integrated circuit package. The function of the tie bars 523 is to connect the die attach pad 511 to the rest of the leadframe 510 so that the die attach pad 511 may be easily held in place during mounting of the semiconductor die 514, bonding with the bond wires 516, and enclosing of the leadframe 510, die 514 and bond wires 516 in the protective material.

Figure 6:
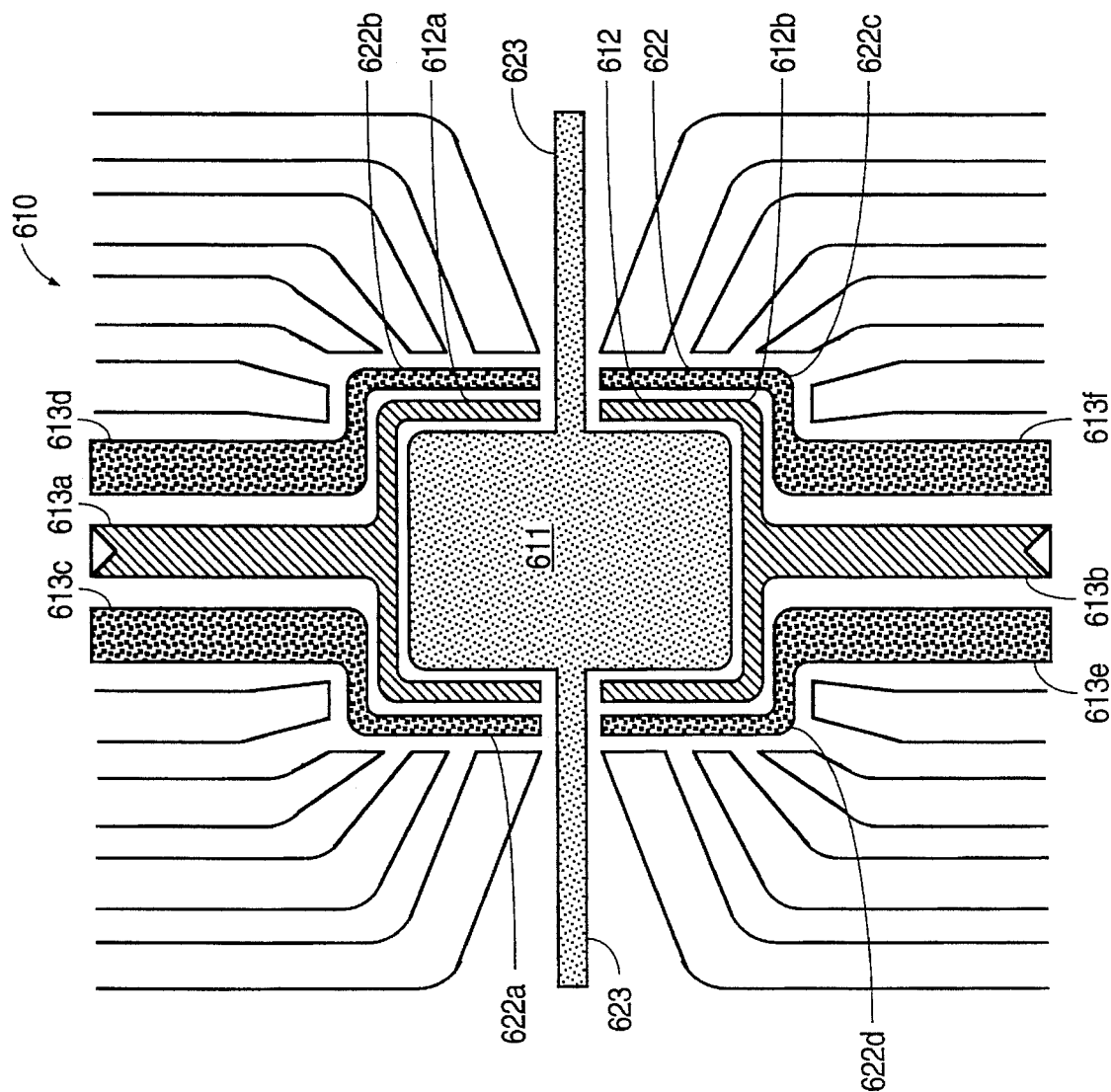
FIG. 6 is a plan view of a leadframe according to another embodiment of the invention.

FIG. 6 is a plan view of a leadframe 610 according to another embodiment of the invention. The leadframe 610 comprises a die attach pad 611, a first electrically conductive ring 612, a second electrically conductive ring 622, and a plurality of leads 613. (As before, particular leads are identified as, for instance, lead 613a. All leads or a typical lead are referred to as leads or lead 613.) The first electrically conductive ring 612 is formed generally around the periphery of the die attach pad 611. The second electrically conductive ring 622 is formed generally around the periphery of the first electrically conductive ring 612. The leads 613 are formed generally around the second electrically conductive ring 622, so that most of the leads 613 do not contact the first electrically conductive ring 612 or the second electrically conductive ring 622. None of the leads 613 contact the die attach pad 611.

In the leadframe 610, two leads 613a, 613b are formed integrally with the first electrically conductive ring 612. Four leads 613c, 613d, 613e, 613f are formed integrally with the second electrically conductive ring 622. (It is to be understood that any desired number of leads 613 could be formed integrally with one or the other of the rings 612 or 622.) Since electrical isolation between the first electrically conductive ring 612, the second electrically conductive ring 622, and die attach pad 611 must be maintained, the first electrically conductive ring 612 is broken into two sections 612a, 612b by the tie bars 623, and the second electrically conductive ring 622 is broken into four sections 622a, 622b, 622c, 622d by the tie bars 623 and leads 613a, 613b.

The die attach pad 611 is connected to the remainder of the leadframe through tie bars 623. After the leadframe 610 is enclosed in protective electrically insulative material, the exposed sections of the tie bars 623 are removed. In an alternative embodiment of the invention, the die attach pad 611 could be formed integrally with one or more leads 613.

The leadframe 610 is assembled into an integrated circuit package in a manner similar to that explained above for other embodiments of the invention. Electrically conductive bond wires are used to connect selected bond pads on a die attached to the die attach pad 611, selected ones of the leads 613, selected bond locations on the first electrically conductive ring 612, and selected bond locations on the second electrically conductive ring 622. Each of the first electrically conductive ring sections 612a, 612b, the second electrically conductive ring sections 622a, 622b, 622c, 622d and the die attach pad 611 (if the die attach pad 611 is formed integrally with one or more of the leads 613) may be connected through the appropriate leads 613 to a voltage source outside the package. In particular, each of the ring sections 612a, 612b, 622a, 622b, 622c, 622d and die attach pad 611 may function as either a power plane or ground plane.

Various embodiments of the invention have been described. The descriptions are intended to be illustrative, not limitative. Thus, it will be apparent to one skilled in the art that certain modifications may be made to the invention as described without departing from the scope of the claims set out below.

We claim:

1. A leadframe, comprising:
   a plurality of electrically conductive leads;
   a die attach pad on which a semiconductor die can be mounted; and
   an electrically conductive ring outside a perimeter of the die attach pad, the electrically conductive ring being electrically isolated from the die attach pad and being located between one or more of the leads and the die attach pad, at least one of the leads being formed integrally with the ring.

2. A leadframe comprising:
   a plurality of electrically conductive leads;
   a die attach pad on which a semiconductor die can be mounted, wherein the die attach pad is electrically conductive, and at least one of the leads is formed integrally with the die attach pad; and
   an electrically conductive ring outside a perimeter of the die attach pad and between one or more of the leads and the die attach pad, at least one of the leads being formed integrally with the ring.

3. A leadframe as in claim 2, wherein a plurality of leads are formed integrally with the die attach pad.

4. A leadframe as in claim 3, wherein a plurality of leads are formed integrally with the ring.

5. A leadframe as in claim 4, formed by stamping the leadframe out of a single plate.

6. A leadframe as in claim 4, formed by etching the leadframe out of a single plate.

7. A leadframe as in claim 1, wherein a plurality of leads are formed integrally with the ring.

8. A leadframe as in claim 7, wherein the ring is formed in sections that are electrically isolated from each other.

9. A leadframe as in claim 1, further comprising a second electrically conductive ring outside a perimeter of the first electrically conductive ring and between one or more of the leads and the first electrically conductive ring, at least one of the leads being formed integrally with the second electrically conductive ring.

10. A leadframe, comprising:
    an electrically conductive die attach pad having a surface on which a semiconductor die can be mounted;
    a plurality of electrically conductive leads, wherein each of the leads has a surface in substantially the same plane as the surface of the die attach pad, and wherein at least one of the leads is formed integrally with the die attach pad; and
    an electrically conductive ring formed between one or more of the leads and the die attach pad, wherein the ring has a surface in substantially the same plane as the surface of the die attach pad, and wherein at least one of the leads is formed integrally with the ring.

11. A leadframe as in claim 10, wherein:
    a plurality of leads are formed integrally with the die attach pad; and
    a plurality of leads are formed integrally with the ring.

12. A leadframe as in claim 11, wherein the ring is formed in sections that are electrically isolated from each other.

13. A leadframe as in claim 10, formed by stamping the leadframe out of a single plate.

14. A leadframe as in claim 10, formed by etching the leadframe out of a single plate.

15. A leadframe as in claim 10, further comprising a second electrically conductive ring formed between one or more of the leads and the first electrically conductive ring, wherein the second electrically conductive ring has a surface in substantially the same plane as the surface of the die attach pad.

16. A structure, comprising:
    a semiconductor die on which electrical circuitry and a plurality of bond pads are formed;
    a leadframe, the leadframe comprising:
       a die attach pad on which the semiconductor die is mounted;
       a plurality of electrically conductive leads; and
       an electrically conductive ring, wherein:
          at least one of the leads is formed integrally with the ring; and
          the electrically conductive ring is outside a perimeter of the die attach pad and between one or more of the leads and the die attach pad such that the ring is electrically isolated from the die attach pad;
    a plurality of electrically conductive bond wires, wherein:
       at least one bond wire is connected between a bond pad and the ring; and
       at least one bond wire is connected between a bond pad and a selected one of the plurality of leads; and
    protective, electrically insulative material enclosing the semiconductor die, leadframe, and bond wires.

17. A structure comprising:
    a semiconductor die on which electrical circuitry and a plurality of bond pads are formed;
    a leadframe, the leadframe comprising:
       a die attach pad on which the semiconductor die is mounted, wherein the die attach pad is electrically conductive;
       a plurality of electrically conductive leads, wherein at least one of the leads is formed integrally with the die attach pad; and
       an electrically conductive ring, wherein:
          at least one of the leads is formed integrally with the ring; and
          the electrically conductive ring is outside a perimeter of the die attach pad and between one or more of the leads and the die attach pad such that the ring is electrically isolated from the die attach pad;

a plurality of electrically conductive bond wires, wherein:
at least one bond wire is connected between a bond pad and the die attach pack;
at least one bond wire is connected between a bond pad and the ring; and
at least one bond wire is connected between a bond pad and a selected one of the plurality of leads; and protective, electrically insulative material enclosing the semiconductor die, leadframe, and bond wires.

18. A structure in claim 17, wherein a plurality of leads are formed integrally with the die attach pad.

19. A structure as in claim 18, wherein a plurality of leads are formed integrally with the ring.

20. A structure as in claim 19, wherein the leadframe is formed by stamping the leadframe out of a single plate.

21. A structure as in claim 19, wherein the leadframe is formed by etching the leadframe out of a single plate.

22. A structure as in claim 19, wherein:
the die attach pad is a ground plane; and
the ring is a power plane.

23. A structure as in claim 19, wherein:
the die attach pad is a power plane; and
the ring is a ground plane.

24. A structure as in claim 16, wherein a plurality of leads are formed integrally with the ring.

25. A structure as in claim 24, wherein the ring is formed in sections that are electrically isolated from each other.

26. A structure as in claim 25, wherein:
a first section of the ring is a ground plane; and
a second section of the ring is a power plane.

27. A structure as in claim 25, wherein at least one section of the ring is held at a different voltage potential than other sections of the ring.

28. A structure as in claim 17, wherein:
the die attach pad is a ground plane; and
the ring is a power plane.

29. A structure as in claim 17, wherein:
the die attach pad is a power plane; and
the ring is a ground plane.

30. A structure as in claim 16, wherein:
the leadframe further comprises a second electrically conductive ring;
at least one of the leads is formed integrally with the second electrically conductive ring;
the second electrically conductive ring is formed outside the perimeter of the die attach pad and between one or more of the leads and the first electrically conductive ring such that the second electrically conductive ring is electrically isolated from the first electrically conductive ring; and
at least one bond wire is connected between a bond pad and the second electrically conductive ring.

31. A structure as in claim 30, wherein:
the first electrically conductive ring is a ground plane; and
the second electrically conductive ring is a power plane.

32. A structure as in claim 30, wherein:
the first electrically conductive ring is a power plane; and
the second electrically conductive ring is a ground plane.

33. A structure, comprising:
a semiconductor die on which electrical circuitry and a plurality of bond pads are formed;
a leadframe, the leadframe comprising:
a die attach pad having a surface on which the semiconductor die is mounted;
a plurality of electrically conductive leads, each having a surface in the same plane as the surface of the die attach pad; and
an electrically conductive ring, wherein:
the electrically conductive ring is outside a perimeter of the die attach pad and between one or more of the leads and the die attach pad such that the ring is electrically isolated from the die attach pad; and
the ring has a surface in substantially the same plane as the surface of the die attach pad;

a plurality of electrically conductive bond wires, wherein:
at least one bond wire is connected between a bond pad and the ring; and
at least one bond wire is connected between a bond pad and a selected one of the plurality of leads; and
protective, electrically insulative material enclosing the semiconductor die, leadframe, and bond wires.

34. A structure as in claim 33, wherein:
the die attach pad is electrically conductive;
at least one of the leads is formed integrally with the die attach pad; and
at least one of the leads is formed integrally with the ring;
at least one bond wire is connected between a bond pad and the die attach pad.

35. A structure as in claim 34, wherein:
a plurality of leads are formed integrally with the die attach pad; and
a plurality of leads are formed integrally with the ring.

36. A structure as in claim 35, wherein:
the die attach pad is a ground plane; and
the ring is a power plane.

37. A structure as in claim 35, wherein:
the die attach pad is a power plane; and
the ring is a ground plane.

38. A structure as in claim 35, wherein the ring is formed in sections that are electrically isolated from each other.

39. A structure as in claim 38, wherein:
a first section of the ring is a ground plane; and
a second section of the ring is a power plane.

40. A structure as in claim 38, wherein at least one section of the ring is held at a different voltage potential than other sections of the ring.

41. A structure as in claim 33, wherein the leadframe is formed by stamping the leadframe out of a metal plate.

42. A structure as in claim 33, wherein the leadframe is formed by etching the leadframe out of a metal plate.

43. A structure as in claim 33, wherein:
the die attach pad is a ground plane; and
the ring is a power plane.

44. A structure as in claim 33, wherein:
the die attach pad is a power plane; and
the ring is a ground plane.

45. A structure as in claim 34, wherein:
the leadframe further comprises a second electrically conductive ring;
the second electrically conductive ring is outside the perimeter of the die attach pad and between one or more of the leads and the first electrically conductive ring such that the second electrically conductive ring is electrically isolated from the first electrically conductive ring;

the second electrically conductive ring has a surface in substantially the same plane as the surface of the die attach pad; and at least one bond wire is connected between a bond pad and the second electrically conductive ring.

46. A structure as in claim 45, wherein:

the first electrically conductive ring is a ground plane; and the second electrically conductive ring is a power plane.

47. A structure as in claim 45, wherein:

the first electrically conductive ring is a power plane; and the second electrically conductive ring is a ground plane.

* * * * *